(12) United States Patent
Omine et al.

(10) Patent No.: US 10,186,656 B2
(45) Date of Patent: Jan. 22, 2019

(54) MAGNETORESISTIVE ELEMENT AND MAGNETIC MEMORY

(71) Applicant: TOSHIBA MEMORY CORPORATION, Minato-ku (JP)

(72) Inventors: Shumpei Omine, Meguro (JP); Takeshi Iwasaki, Kuwana (JP); Masaki Endo, Kawasaki (JP); Akiyuki Murayama, Koto (JP); Tadaomi Daibou, Yokohama (JP); Tadashi Kai, Yokohama (JP); Junichi Ito, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/703,409

(22) Filed: Sep. 13, 2017

(65) Prior Publication Data

US 2018/0269382 A1    Sep. 20, 2018

(30) Foreign Application Priority Data

Mar. 16, 2017 (JP) .................................. 2017-051672

(51) Int. Cl.
  *H01L 43/02* (2006.01)
  *H01L 43/08* (2006.01)
  *H01L 43/12* (2006.01)
  *H01L 43/10* (2006.01)

(52) U.S. Cl.
  CPC .............. *H01L 43/02* (2013.01); *H01L 43/08* (2013.01); *H01L 43/10* (2013.01); *H01L 43/12* (2013.01)

(58) Field of Classification Search
  None
  See application file for complete search history.

(56) References Cited

U.S. PATENT DOCUMENTS

| 7,663,197 | B2 | 2/2010 | Nagase et al. |
| 8,107,281 | B2 | 1/2012 | Kai et al. |
| 8,680,632 | B2 | 3/2014 | Daibou et al. |

(Continued)

FOREIGN PATENT DOCUMENTS

| JP | 2007-142364 | 6/2007 |
| JP | 2010-232499 | 10/2010 |

(Continued)

OTHER PUBLICATIONS

Shimada, Y., "Amorphous Co-Metal Films Produced by Sputtering", Phys. Stat. Sol. (1) 83, 255 (1984).*

(Continued)

*Primary Examiner* — Joseph Schoenholtz
(74) *Attorney, Agent, or Firm* — Oblon, McClelland, Maier & Neustadt, L.L.P.

(57) ABSTRACT

A magnetic memory according to an embodiment includes: a first magnetic layer; a second magnetic layer; a first nonmagnetic layer disposed between the first magnetic layer and the second magnetic layer; a third magnetic layer disposed between the first magnetic layer and the first nonmagnetic layer; and a first layer disposed between the first magnetic layer and the third magnetic layer, wherein the first layer contains at least one element selected from the group consisting of Co, Fe, Ni, and Mn, and at least one element selected from the group consisting of Ta, Mo, Zr, Nb, Hf, V, Ti, Sc, and La.

22 Claims, 8 Drawing Sheets

THICKNESS OF LAYER 12 (Å)

(56) References Cited

U.S. PATENT DOCUMENTS

| | | | |
|---|---|---|---|
| 8,895,162 B2 | 11/2014 | Nishiyama et al. | |
| 2003/0026048 A1* | 2/2003 | Yamanaka | B82Y 10/00 360/324.2 |
| 2009/0080238 A1* | 3/2009 | Yoshikawa | H01L 27/228 365/158 |
| 2012/0243305 A1* | 9/2012 | Nakayama | H01L 27/228 365/158 |
| 2014/0264673 A1* | 9/2014 | Kitagawa | H01L 43/10 257/421 |
| 2016/0380029 A1 | 12/2016 | Hase et al. | |
| 2016/0380185 A1 | 12/2016 | Kato et al. | |

FOREIGN PATENT DOCUMENTS

| | | |
|---|---|---|
| JP | 2011-71352 | 4/2011 |
| JP | 2012-204683 | 10/2012 |
| JP | 2014-135449 | 7/2014 |
| JP | 2015-176933 | 10/2015 |
| JP | 2016-63150 | 4/2016 |

OTHER PUBLICATIONS

Zhu, T., et al. "The Study of Perpendicular Magnetic Anisotropy in CoFeB Sandwiched by MgO and Tantalum Layers Using Polarized Neutron Reflectometry." Applied Physics Letters, vol. 100, No. 20, 2012, p. 202406., doi:10.1063/1.4718423.*
M Ali and P J Grundy 1983 J. Phys. D: Appl. Phys. 16 2239.*
Masateru Nose, et al. "Effect of Annealing on Magnetic Properties of Co—Ni—Mo—Zr Amorphous Alloys", J. Japan Inst. Metals, vol. 54, No. 6, 1990, 8 pages ( with English Abstract).

* cited by examiner

MAGNETORESISTIVE ELEMENT AND MAGNETIC MEMORY

CROSS REFERENCE TO RELATED APPLICATIONS

This application is based upon and claims the benefit of priority from the prior Japanese Patent Application No. 2017-051672, filed on Mar. 16, 2017, the entire contents of which are incorporated herein by reference.

FIELD

Embodiments described herein relate generally to magnetoresistive elements and magnetic memories.

BACKGROUND

A magnetic tunnel junction (MTJ) element as a magnetoresistive element has a basic structure that is a stack structure that includes a storage layer having a changeable magnetization direction, a reference layer having a fixed magnetization direction, and an insulating layer provided between the storage layer and the reference layer. Such an MTJ element is known to have a tunneling magnetoresistive (TMR) effect, and is used as the memory element of a memory cell in a magnetoresistive random access memory (MRAM).

An MRAM is a nonvolatile magnetic memory that stores information ("1" or "0") depending on changes in the relative angle between the magnetization directions of the magnetic layers in each MTJ element. As the magnetization switching speed is several nanoseconds, high-speed data writing and high-speed data reading can be performed. In view of this, MRAMs are expected to be next-generation high-speed nonvolatile memories. Further, where a technique called spin-injection magnetization switching is used to control magnetization with a spin-polarized current, the cell size in an MRAM is reduced, and the current density increases accordingly. With this, the magnetization of each storage layer can be readily switched, and a high-density MRAM that consumes less power can be formed.

To increase the density of a nonvolatile memory, it is preferable to increase the degree of magnetoresistive element integration. Further, to reduce the write current while increasing the degree of integration, MRAMs using MTJ elements containing a magnetic material having a magnetization direction perpendicular to the film plane, or a magnetic material having perpendicular magnetic anisotropy, have been developed in recent years.

Normally, a writing current for switching a magnetization direction by the spin transfer torque switching technique depends on the saturation magnetization and the magnetic relaxation constant of the storage layer. Therefore, there is a demand for a storage layer that has a lower saturation magnetization and a lower magnetic relaxation constant so that the magnetization direction of the storage layer can be switched by low-current spin injection.

Further, as devices become smaller, the devices are more easily affected by thermal disturbance. Therefore, each storage layer is expected to have a high perpendicular magnetic anisotropy. An interfacial layer that is interposed between a storage layer and an insulating layer and is exchange-coupled to the storage layer does not have a sufficiently high perpendicular magnetic anisotropy. Therefore, each interfacial layer is expected to have a high magnetoresistance ratio and a high perpendicular magnetic anisotropy by forming a stack structure with a storage layer.

A storage layer and an interfacial layer each have a magnetoresistance ratio and a perpendicular magnetic anisotropy at a high degree of crystallization, but have different crystalline structures. Therefore, when a storage layer and an interfacial layer are stacked directly on each other, the crystal orientations are disturbed.

DETAILED DESCRIPTION

First, before describing the embodiment of the present invention, the course of events for achieving the present invention will be described below.

In a case where a magnetic layer (called an interfacial layer) is stacked between a storage layer and a nonmagnetic layer serving as a tunnel barrier, crystallization from the storage layer side hinders crystallization of the interfacial layer due to lattice mismatch between the storage layer and the interfacial layer, and leads to a decrease in magnetoresistance ratio. In view of this, a layer is inserted between the storage layer and the interfacial layer, so that crystallization from the storage layer side can hinder crystallization of the interfacial layer, and separate the crystals. It is easier to separate the crystals by inserting a layer having a greater thickness. However, in a case where the layer to be inserted is a nonmagnetic layer, the exchange coupling between the storage layer and the interfacial layer is easily cut off. Therefore, it is critical to select a suitable material for maintaining exchange coupling and separating crystals, and adjust the thickness of the layer to be inserted.

In such circumstances, the inventors have come to think that the layer to be inserted between the storage layer and the interfacial layer should be made to have magnetic properties so that the crystallization of the interfacial layer can be facilitated while the exchange coupling is maintained, and thus, magnetoresistive elements and a magnetic memory each having a high perpendicular magnetic anisotropy and a high magnetoresistance ratio can be obtained.

A magnetic memory according to an embodiment includes: a first magnetic layer; a second magnetic layer; a first nonmagnetic layer disposed between the first magnetic layer and the second magnetic layer; a third magnetic layer disposed between the first magnetic layer and the first nonmagnetic layer; and a first layer disposed between the first magnetic layer and the third magnetic layer, wherein the first layer contains at least one element selected from the group consisting of Co, Fe, Ni, and Mn, and at least one element selected from the group consisting of Ta, Mo, Zr, Nb, Hf, V, Ti, Sc, and La.

The following is a description of magnetoresistive elements according to embodiments, with reference to the accompanying drawings.

(First Embodiment)

Figure 1:
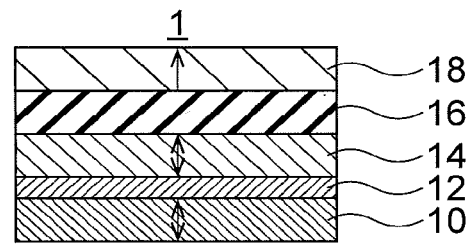
FIG. 1 is a cross-sectional view of a magnetoresistive element according to a first embodiment.

FIG. 1 shows a cross-section of a magnetoresistive element according to a first embodiment. The magnetoresistive element 1 of the first embodiment is an MTJ element, and has a stack structure in which a magnetic layer 10, a layer 12, a magnetic layer 14, a nonmagnetic layer 16, and a magnetic layer 18 are stacked in this order. The magnetic layer (first magnetic layer) 10 has a changeable magnetization direction, and is also called the storage layer. The magnetic layer (second magnetic layer) 18 has a fixed magnetization direction, and is also called the reference layer. The magnetic layer (third magnetic layer) 14 has a changeable magnetization direction, and is also called the interfacial layer. Here, "a changeable magnetization direction" is a magnetization direction that can change before and after writing, and "a fixed magnetization direction" is a magnetization direction that does not change before and after writing.

Figure 2:
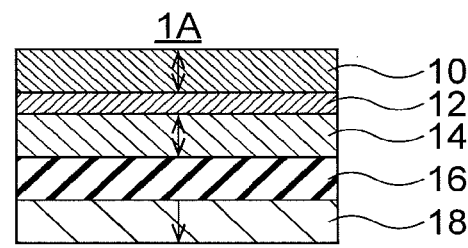
FIG. 2 is a cross-sectional view of a magnetoresistive element according to a modification of the first embodiment.

The magnetoresistive element may be a magnetoresistive element 1A of a modification shown in FIG. 2. In the magnetoresistive element 1A, the order of stacked layers may be reversed. It should be noted that the storage layer 10 and the interfacial layer 14 are coupled to each other in a magnetic exchange coupling via the layer 12. That is, when the magnetization direction of the storage layer 10 changes, the magnetization direction of the interfacial layer 14 also changes.

(Write Operation)

A write operation to be performed on the magnetoresistive element 1 of the first embodiment having the above described structure is now described. For ease of explanation, a write current is made to flow between the storage layer 10 and the reference layer 18 in a direction perpendicular to the film plane. In a case where the magnetization direction of the storage layer is antiparallel to (the opposite direction from) the magnetization direction of the reference layer 18, the write current is applied in the direction from the storage layer 10 toward the reference layer 18. In this case, electrons flow from the reference layer 18 into the interfacial layer 14, the layer 12, and the storage layer 10 through the nonmagnetic layer 16. Electrons that are spin-polarized when passing through the magnetic layer 18 flow into the storage layer 10. The spin-polarized electrons that have spins in the same direction as the magnetization of the storage layer 10 pass through the storage layer 10, but the spin-polarized electrons that have spins in the opposite direction from the magnetization of the storage layer 10 apply a spin torque to the magnetization of the storage layer 10 so that the magnetization direction of the storage layer 10 will switch to the same direction as the magnetization of the reference layer 18. As a result, the magnetization direction of the storage layer 10 is switched, and becomes parallel to (the same as) the magnetization direction of the reference layer 18.

In a case where the magnetization direction of the storage layer 10 is parallel to the magnetization direction of the reference layer 18, the write current is applied in the direction from the reference layer 18 toward the storage layer 10. In this case, electrons flow from the storage layer 10 into the reference layer 18 through the layer 12, the interfacial layer 14, and the nonmagnetic layer 16. Electrons that are spin-polarized when passing through the storage layer 10 flow into the reference layer 18. The spin-polarized electrons that have spins in the same direction as the magnetization of the reference layer 18 pass through the reference layer 18, but the spin-polarized electrons that have spins in the opposite direction from the magnetization of the reference layer 18 are reflected by the interface between the nonmagnetic layer 16 and the reference layer 18, and flow back into the storage layer 10 through the nonmagnetic layer 16. As a result, a spin torque is applied to the magnetization of the storage layer 10 so that the magnetization direction of the storage layer 10 will become the opposite from the magnetization direction of the reference layer 18. Consequently, the magnetization direction of the storage layer 10 is switched, and becomes antiparallel to the magnetization direction of the reference layer 18.

Reading from the magnetoresistive element 1 of the first embodiment is performed by applying a read current between the storage layer 10 and the reference layer 18, and then measuring the voltage between the storage layer 10 and the reference layer 18, for example.

Next, the materials of the respective members constituting the magnetoresistive element 1 are described.

(Storage Layer 10)

The storage layer 10 is a magnetic layer that has a high perpendicular magnetic anisotropy, and is capable of complementing the magnetic anisotropy of the interfacial layer 14. An artificial lattice containing a noble metal element and a magnetic element is used as the storage layer 10 so that a high perpendicular magnetic anisotropy can be achieved. At least one element is selected as the noble metal element from the group consisting of Ag, Au, Pd, Pt, Ni, Ru, and Rh, and at least one element is selected as the magnetic element from the group consisting of Co, Fe, Mn, and Ni. As used herein, a phrase referring to "at least one of " a list of items refers to any combination of those items, including a single member. As an example, "at least one of: a, b, or c " is intended to cover "a, b, c, a-b, a-c, b-c, and a-b-c." Examples of such artificial lattices include a Co/Pt artificial lattice, a Co/Pd artificial lattice, a CoCr/Pt artificial lattice, a Co/Ru artificial lattice, a Co/Os artificial lattice, a Co/Au artificial lattice, or a Ni/Cu artificial lattice. Each of these artificial lattices can control the magnetic anisotropy energy density and the saturation magnetization by adjusting the addition of an element to the magnetic layer and the thickness ratio between the magnetic layer and the nonmagnetic layer.

(Layer 12)

The layer 12 is preferably an amorphous layer, so as to separate the crystals of the storage layer 10 and the interfacial layer 14 from each other. In a case where boron is contained in the interfacial layer 14, the layer 12 preferably contains an element that has a negative formation enthalpy with a great absolute value, such as an additive element having a formation enthalpy ΔH of −150 kJ/mol or less. Candidates for the additive element include at least one element selected from the group consisting of Ta, Mo, Zr, Nb, Hf, V, Ti, Sc, and La. These additive elements each have a high melting point, and contribute to reduction of interdiffusion accordingly. Also, to separate the crystals of the storage layer 10 and the interfacial layer 14 from each other, the layer 12 preferably has a certain thickness. However, if the thickness is too great, exchange coupling between the storage layer 10 and the interfacial layer 14 cannot be maintained. A material containing at least one element selected from the group consisting of Co, Fe, Mn, and Ni is used as the layer 12, so that exchange coupling between the storage layer 10 and the interfacial layer 14 can be maintained.

In a case where an artificial lattice containing a noble metal and a magnetic element is used as the storage layer 10, and the storage layer 10 and the interfacial layer 14 are stacked directly on each other, the noble metal easily diffuses due to heat, and there is a risk of mixing of the noble metal with the interfacial layer 14. However, diffusion of the noble metal can be prevented where the layer 12 is interposed between the storage layer 10 and the interfacial layer 14 as in the first embodiment.

(Interfacial Layer 14)

The interfacial layer 14 is a magnetic layer with a magnetization direction that can be switched by the action of spin-polarized electrons. To increase the magnetoresistance ratio of the magnetoresistive element, a material with a high spin polarizability is used for the interfacial layer 14 adjacent to the nonmagnetic layer 16 containing MgO, for example. In this case, the storage layer 10 is formed with a metal of a magnetic transition element (Mn, Fe, Co, or Ni), an alloy containing at least one of the above magnetic transition elements, or an alloy containing at least one of the above magnetic transition elements and a nonmagnetic element (at least one element selected from the group consisting of B, Al, Si, Ti, V, Cr, Ga, Ge, and Bi, for example).

(Nonmagnetic Layer 16)

The nonmagnetic layer 16 is made of an insulating material, and therefore, a tunnel barrier layer is used as the nonmagnetic layer 16. The material of the tunnel barrier layer is an oxide containing at least one element selected from the group consisting of magnesium (Mg), calcium (Ca), barium (Ba), aluminum (Al), beryllium (Be), strontium (Sr), zinc (Zn), and titanium (Ti). Specific examples of such oxides include MgO, AlO, ZnO, SrO, or TiO. Alternatively, the tunnel barrier layer may be a mixed crystal material formed with two or more materials selected from the group consisting of the above oxides, or may be a stack structure formed with these materials. Examples of mixed crystal materials include MgAlO, MgZnO, MgTiO, or MgCaO. Examples of two-layer stack structures include MgO/ZnO, MgO/AlO, TiO/AlO, or MgAlO/MgO. Examples of three-layer stack structures include AlO/MgO/AlO or ZnO/MgO/ZnO. It should be noted that the left side of the symbol "/" indicates the upper layer, and the right side of the symbol "/" indicates the lower layer.

(Reference Layer 18)

Other examples of materials that can be used for the reference layer 18 include alloys each containing at least one element selected from the group consisting of Fe, Co, and Ni, which are transition metals, and at least one element selected from the group consisting of Tb, Dy, and Gd, which are rare-earth metals. Examples of such alloys include TbFe, TbCo, TbFeCo, DyTbFeCo, or GdTbCo. Alternatively, a multi-layer structure in which these alloys are alternately stacked may be used. Specifically, examples of such multi-layer structures include multi-layer films such as TbFe/Co, TbCo/Fe, TbFeCo/CoFe, DyFe/Co, DyCo/Fe, or DyFeCo/CoFe. Each of these alloys can control the magnetic anisotropy energy density and the saturation magnetization by adjusting the thickness ratio and the composition.

The reference layer 18 has the axis of easy magnetization in a direction perpendicular to the film plane or in a direction parallel to the direction of stacking. Materials that can be used for the reference layer 18 are metals that are crystal-oriented in the (111) direction of a face-centered cubic (FCC) structure or in the (001) direction of a hexagonal close-packed (HCP) structure, or metals that can form artificial lattices, for example. Examples of metals that are crystal-oriented in the (111) direction of FCC or are crystal-oriented in the (001) direction of HCP include alloys each containing at least one element selected from the first group consisting of Fe, Co, Ni, and Cu, and at least one element selected from the second group consisting of Pt, Pd, Rh, and Au. Specifically, these examples include ferromagnetic alloys such as CoPd, CoPt, NiCo, or NiPt.

Examples of artificial lattices that can be used for the reference layer 18 include structures in which at least one element selected from the group consisting of Fe, Co, and Ni or an alloy (a magnetic layer) containing the one element, and at least one element selected from the group consisting of Cr, Pt, Pd, Ir, Rh, Ru, Os, Re, Au, and Cu or an alloy (a nonmagnetic layer) containing the one element are alternately stacked. Examples of such artificial lattices include a Co/Pt artificial lattice, a Co/Pd artificial lattice, a CoCr/Pt artificial lattice, a Co/Ru artificial lattice, a Co/Os artificial lattice, a Co/Au artificial lattice, or a Ni/Cu artificial lattice. Each of these artificial lattices can control the magnetic anisotropy energy density and the saturation magnetization by adjusting the addition of an element to the magnetic layer and the thickness ratio between the magnetic layer and the nonmagnetic layer.

(Second Embodiment)

Figure 3:
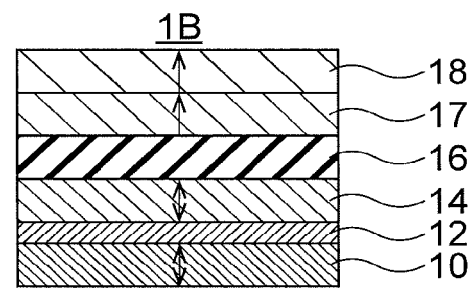
FIG. 3 is a cross-sectional view of a magnetoresistive element according to a second embodiment.

FIG. 3 shows a cross-section of a magnetoresistive element according to a second embodiment. The magnetoresistive element 1B of the second embodiment is an MTJ element, and has a structure in which a storage layer 10 containing a magnetic material, a layer 12, an interfacial layer 14, a nonmagnetic layer 16, an interfacial layer (magnetic layer) 17, and a reference layer 18 are stacked in this order. That is, the magnetoresistive element 1B has the same structure as the magnetoresistive element 1 of the first embodiment shown in FIG. 1, except that the interfacial layer 17 is inserted between the nonmagnetic layer 16 and the reference layer 18. The interfacial layer 17 is formed with the same material as the interfacial layer 12. Although not shown in any of the drawings, the stacking order may be reversed in the stack structure as in the modification of the first embodiment.

(Third Embodiment)

Figure 4:
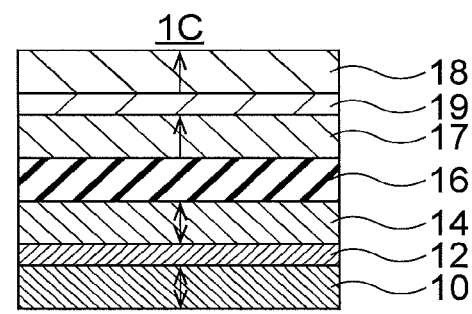
FIG. 4 is a cross-sectional view of a magnetoresistive element according to a third embodiment.

FIG. 4 shows a cross-section of a magnetoresistive element according to a third embodiment. The magnetoresistive element 1C of the third embodiment is an MTJ element, and has a structure in which a storage layer 10 containing a magnetic material, a layer 12, an interfacial layer 14, a nonmagnetic layer 16, an interfacial layer 17, a layer 19, and a reference layer 18 are stacked in this order. That is, the magnetoresistive element 1C has the same structure as the magnetoresistive element 1B of the second embodiment shown in FIG. 3, except that the layer 19 is inserted between the layer 17 and the reference layer 18. The layer 19 is formed with the same material as the layer 17.

EXAMPLE 1

Figure 5:
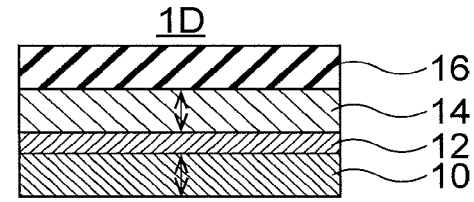
FIG. 5 is a cross-sectional view of a sample in Example 1.

Samples each having the same stack structure as the stack structure including the storage layer 10 through the nonmagnetic layer 16 in the magnetoresistive element 1 of the first embodiment shown in FIG. 1 are prepared as Example 1. Among these samples, the thicknesses of the layers 12 were 1 angstroms, 2 angstroms, 3 angstroms, 4 angstroms, and 5 angstroms. FIG. 5 shows a cross-section of one of these samples.

The materials of the respective layers constituting each of these samples are as follows. A noble metal artificial lattice in which a Co film and a Pd film are stacked, for example, is used as the storage layer 10, $Co_{70}Zr_{15}Mo_{15}$ is used as the layer 12, a CoFeB alloy is used as the magnetic layer 14, and MgO is used as the nonmagnetic layer 16.

Here, $Co_{70}Zr_{15}Mo_{15}$ means that 70 atomic % of Co, 15 atomic % of Zr, and 15 atomic % of Mo are contained.

Figure 6:
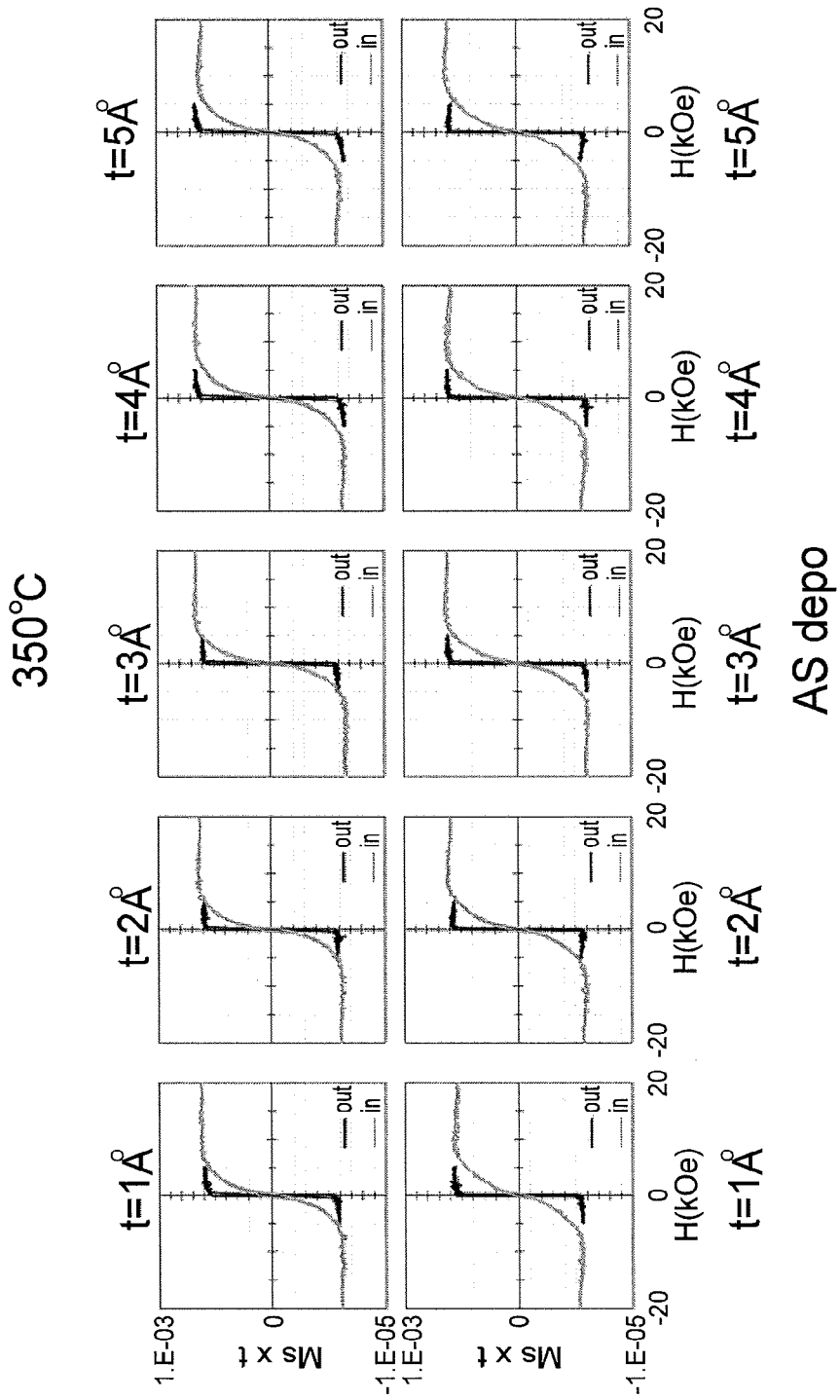
FIG. 6 is graphs showing the results of measurement of the magnetic characteristics of samples with a VSM in Example 1.

The magnetic characteristics of the storage layers 10 of these samples are measured with a vibrating sample magnetometer (VSM), and the results are shown in FIG. 6. In FIG. 6, the symbol "t" represents the thickness of the layer 12. The lower half of FIG. 6 shows the magnetic characteristics of the samples with the varied thicknesses of the layers 12, and the upper half shows the magnetic characteristics of the samples when a heat treatment was conducted at 350° C. As can be seen from FIG. 6, the storage layer 10 of each sample has a perpendicular magnetic anisotropy.

Figure 7:
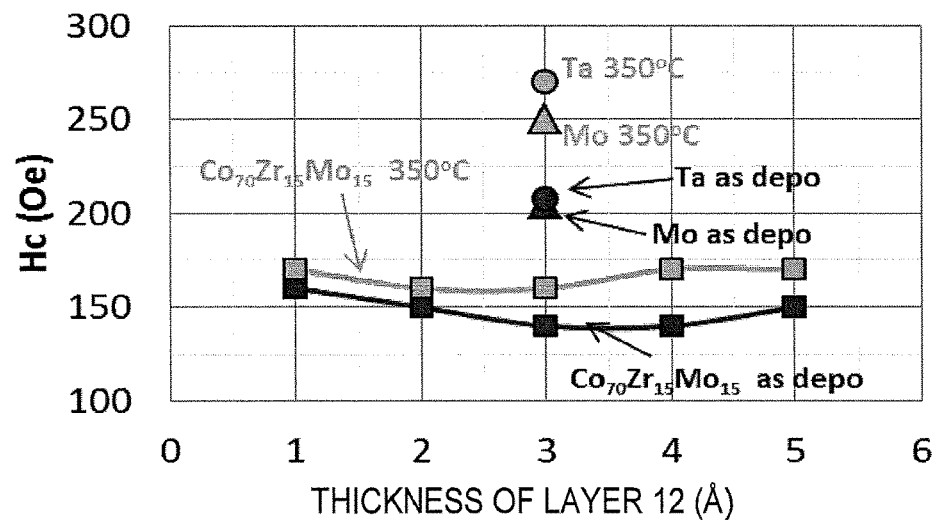
FIG. 7 is a graph showing the results of measurement of the coercive forces of the respective samples in Example 1.

The coercive force of each sample is also measured, and the results are shown in FIG. 7. In VSM measurement, the exchange coupling is considered stronger as the coercive force Hc is lower. As can be seen from FIG. 7, each sample has a low coercive force. This is because the storage layer 10 with a high coercive force is influenced by the interfacial layer 14 with a low coercive force. In Example 1, the coercive forces are in the neighborhood of 150 Oe and do not greatly vary, though the thicknesses of the layers 12 are varied.

Comparative Example

A sample of a comparative example in which Ta or Mo is used as the layer 12 is prepared, and the coercive force of the sample is measured. The result is also shown in FIG. 7. The sample of this comparative example has the same structure as the above samples, except that a Ta layer or a Mo layer with a thickness of 3 angstroms is used as the layer 12. The coercive force of the sample of the comparative example at the time of film formation is approximately 50 Oe higher than that of each sample of Example 1 using $Co_{70}Zr_{15}Mo_{15}$ as the layer 12. Further, when the sample of the comparative example is annealed at 350° C., the coercive force Hc increased 50 Oe or more. This means that, in the comparative example, the exchange coupling between the storage layers 10 and the interfacial layer 14 is weaker than that in Example 1.

In Example 1 using $Co_{70}Zr_{15}Mo_{15}$ as the layer 12, on the other hand, the coercive force increased only 10 to 20 Oe, and the increase in the coercive force Hc with temperature is smaller in the manufacturing of the magnetoresistive element 1 that requires annealing. Thus, Example 1 is superior to the comparative example.

EXAMPLE 2

Figure 8:
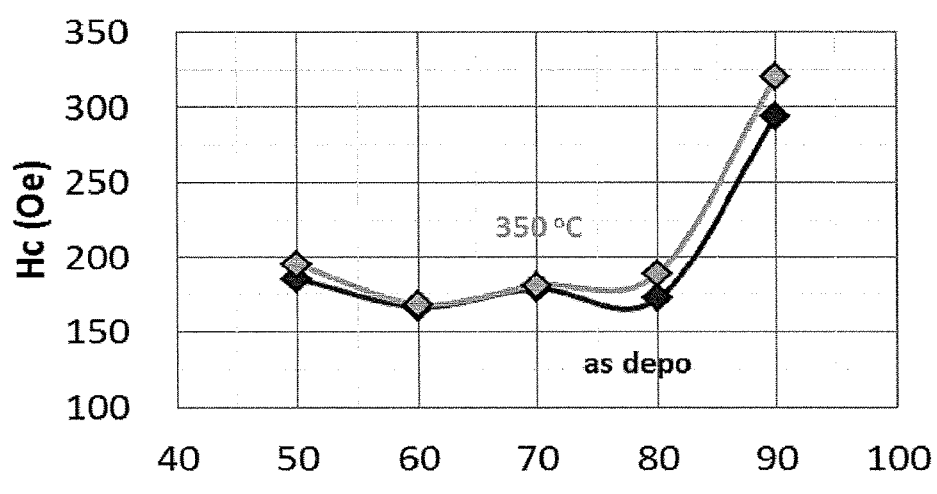
FIG. 8 is a graph showing the results of measurement of the coercive forces of respective samples in Example 2.

Samples in which $Co_xHf_{100-x}$ was used as the layers 12 are prepared as Example 2. Among these samples, the composition rates x of Co are 50 atomic %, 60 atomic %, 70 atomic %, 80 atomic %, and 90 atomic %. The coercive forces Hc of these samples are measured, and the results are shown in FIG. 8. Each sample of Example 2 has the same structure as Example 1, except for the material of the layer 12.

As can be seen from FIG. 8, the coercive force is low when the composition rate x of Co is 80 atomic % or lower at the time of film formation, and the coercive force Hc does not increase even when annealing was performed at 350° C. This means that strong exchange coupling is maintained.

As a magnetic element is added to the layer 12, the layer 12 obtains magnetic properties, and the ferromagnetic coupling between the storage layer 10 and the interfacial layer 14 is maintained. Therefore, the layer 12 preferably has such a composition as to keep magnetic properties.

EXAMPLE 3

Figure 9:
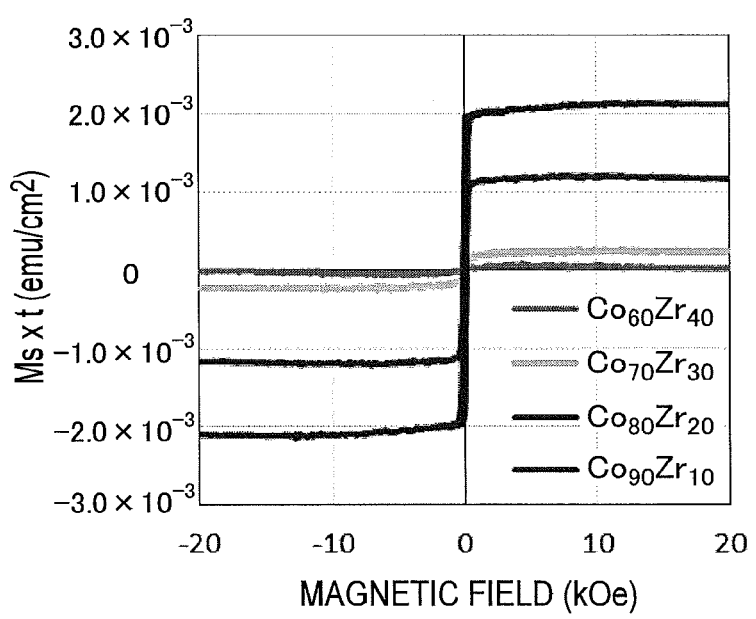
FIG. 9 is a graph showing the results of measurement of the magnetization amounts of respective samples in Example 3.

Samples in which $Co_xZr_{100-x}$ is used as the layers 12 are manufactured as Example 3. Among these samples, the composition rates x of Co are 60 atomic %, 70 atomic %, 80 atomic %, and 90 atomic %. The amounts of magnetization of these samples are measured, and the results are shown in FIG. 9. As can be seen from FIG. 9, where Zr, instead of Co, is increased in the layer 12, the layer 12 with the composition of $Co_{60}Zr_{40}$ loses almost all the magnetic properties.

In view of this, the composition rate of the magnetic element in the layer 12 preferably exceeds 60 atomic %, so that the layer 12 can keep magnetic properties.

Figure 10:
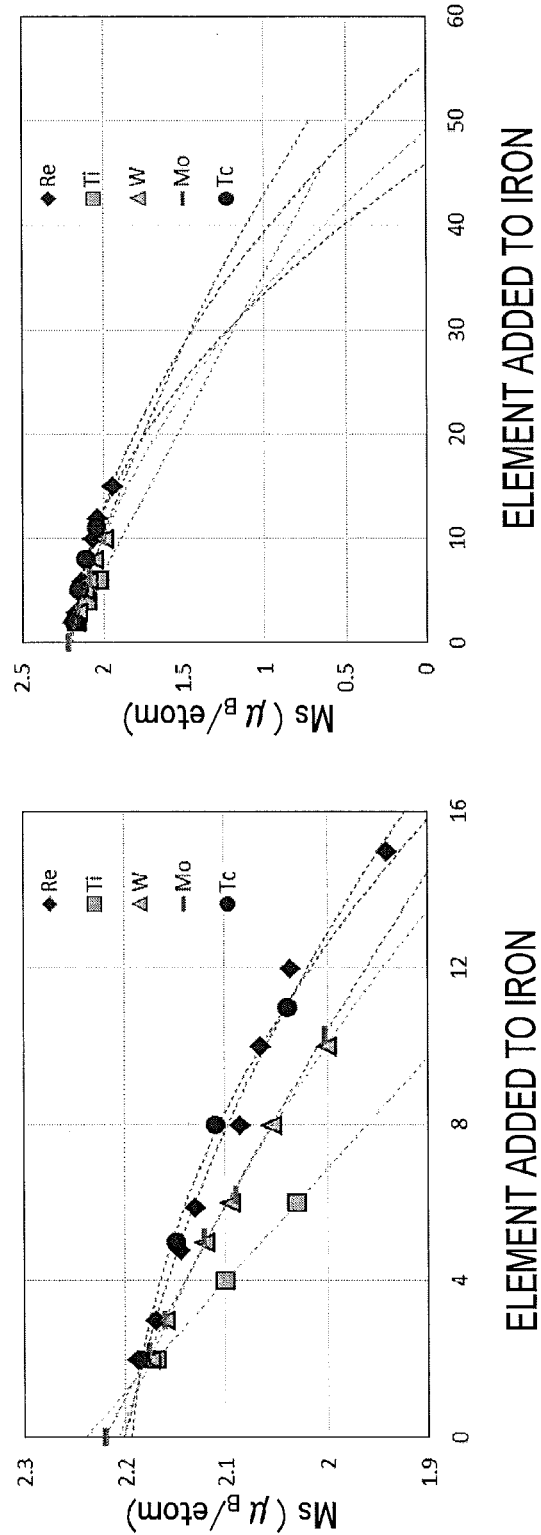
FIG. 10 is graphs showing changes caused in the amount of magnetization when W, Mo, Re, Tc, Ti, or the like was added to Fe in Example 3.

FIG. 10 shows how much the amount of magnetization decreased when W, Mo, Re, Tc, Ti, or the like is added to Fe. As can be seen from FIG. 10, the magnetization becomes 0 when 40 to 50 atomic % of any nonmagnetic element is added through external insertion. Because of this, the composition rate of the magnetic element preferably exceeds 60%.

EXAMPLE 4

Figure 11:
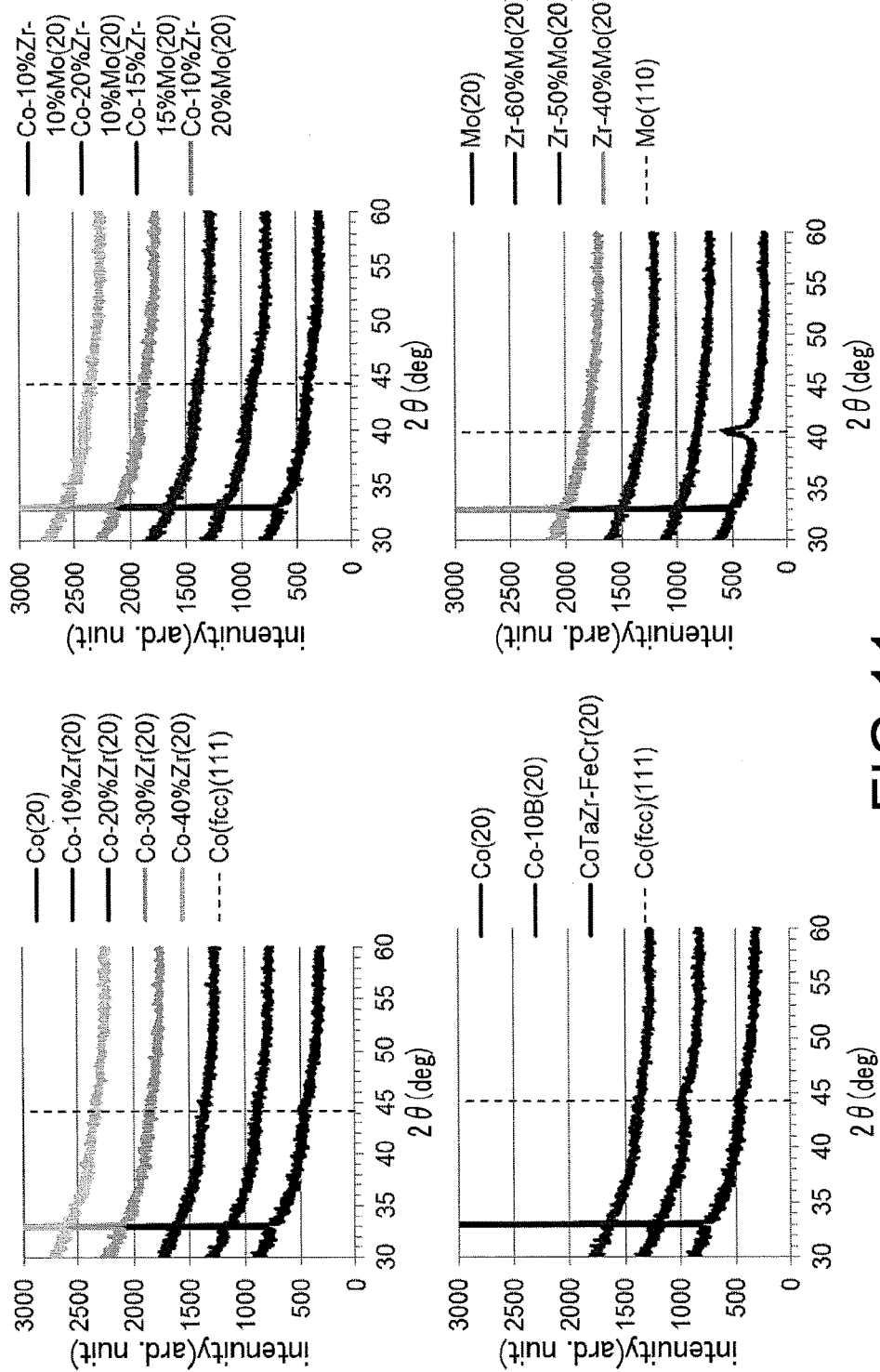
FIG. 11 is graphs showing the results of XRD (X-ray Diffraction) measurement carried out on CoZrMo alloys of 20 nm in thickness.

Since the storage layer 10 and the interfacial layer 14 have different crystal orientations from each other, it is preferable to separate the crystalline structures from each other with the layer 12. Therefore, the layer 12 is preferably an amorphous structure that does not have a specific crystalline structure. FIG. 11 shows the results of XRD (X-ray Diffraction) measurement carries out on CoZrMo alloys of 20 nm in thickness. In a case where the layer 12 is formed only with Co, a peak indicating the (111) plane of Co normally appears. Likewise, in a case where the layer 12 is formed only with Mo, an orientation in the (110) plane appears. However, where Zr and Mo are added to Co, peaks indicating the respective elements, the peak of the alloy, and the like are not observed in the CoZrMo alloys. Because of this, a CoZrMo alloy keeps an amorphous structure in a wide composite range, and is suitable for separating crystals. In view of the above, it is preferable to use a CoZrMo alloy as the layer 12.

As described so far, each of the first through third embodiments and modifications thereof, and the examples can provide a magnetoresistive element having a high magnetoresistance ratio and a high perpendicular magnetic anisotropy.

(Fourth Embodiment)

Next, a magnetic memory (MRAM) according to a fourth embodiment is described.

Figure 12:
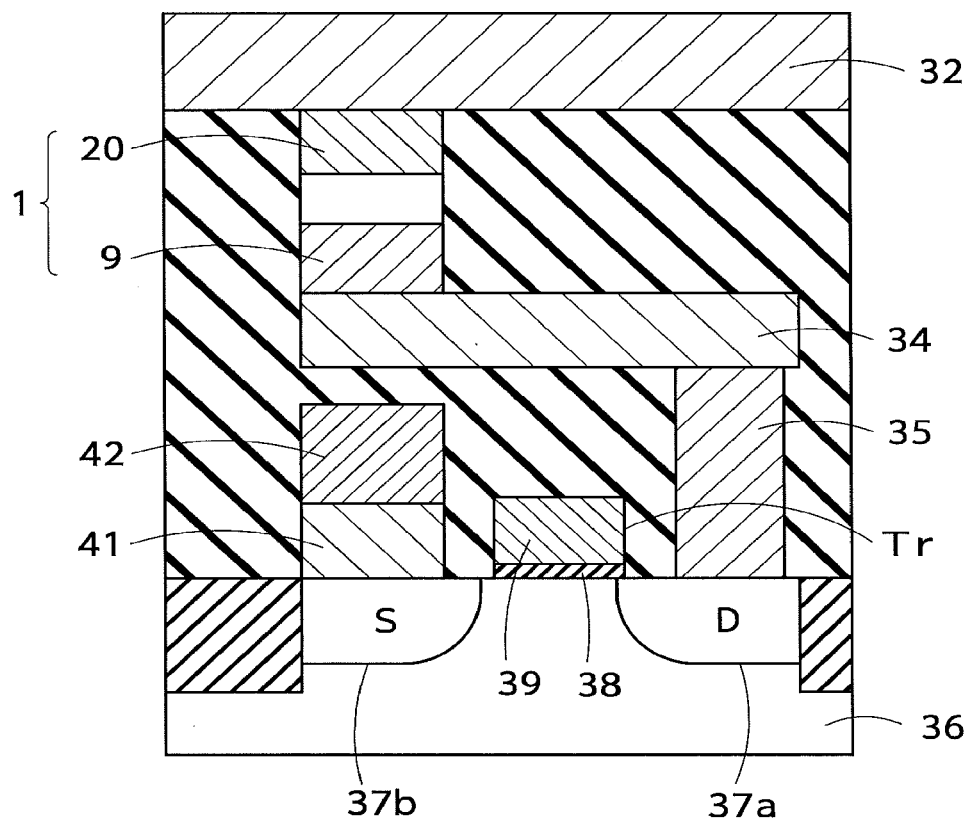
FIG. 12 is a cross-sectional view of the relevant components of a memory cell in an MRAM according to a fourth embodiment.

The MRAM of this embodiment includes memory cells. FIG. 12 shows a cross-section of the relevant components of a memory cell in the MRAM of this embodiment. Each memory cell includes one of the magnetoresistive elements of the first through third embodiments and the modifications thereof as a memory element. In the fourth embodiment, each memory element is the magnetoresistive element 1 of the first embodiment.

As shown in FIG. 12, the upper surface of the magnetoresistive element 1 is connected to a bit line 32 via an upper electrode 20. The lower surface of the magnetoresistive element 1 is connected to the drain region 37*a* of the source/drain regions in the surface of a semiconductor substrate 36, via a lower electrode 9, an leading electrode 34, and a plug 35. The drain region 37*a*, the source region 37*b*, a gate insulating film 38 formed on the substrate 36, and a gate electrode 39 formed on the gate insulating film 38 constitute a select transistor Tr. The select transistor Tr and the magnetoresistive element 1 constitute one memory cell in the MRAM. The source region 37*b* is connected to another bit line 42 via a plug 41. Alternatively, the leading electrode 34 may not be used, and the plug 35 may be disposed under the lower electrode 9 so that the lower electrode 9 and the plug 35 are connected directly to each other. The bit lines 32 and 42, the lower electrode 9, the upper electrode 20, the leading electrode 34, and the plugs 35 and 41 are formed with W, Al, AlCu, Cu, or the like.

Figure 13:
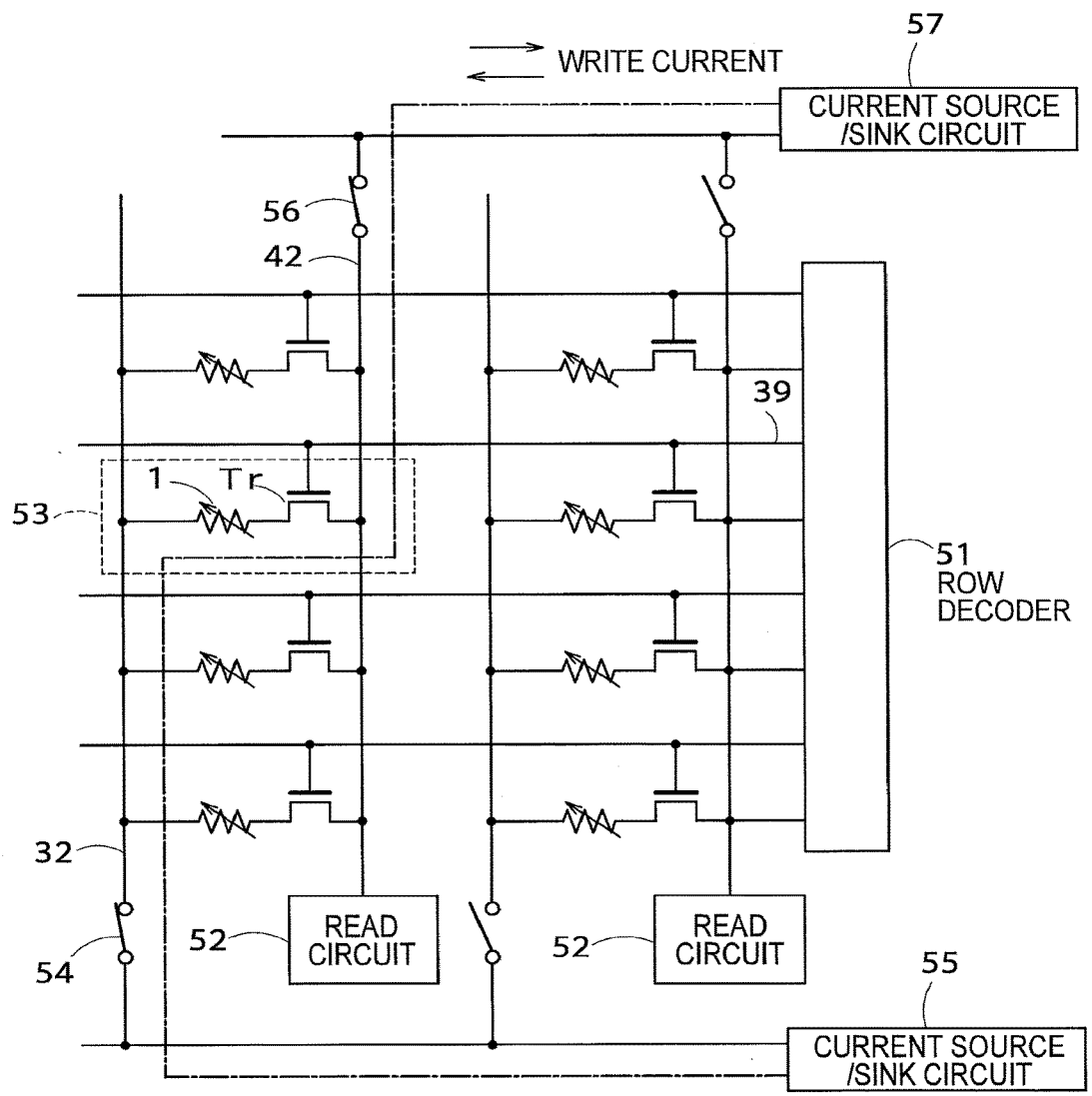
FIG. 13 is a circuit diagram showing the relevant components of the MRAM according to the fourth embodiment.

In the MRAM of this embodiment, the memory cells, one of which is shown in FIG. 12, are arranged in a matrix, to form the memory cell array of the MRAM. FIG. 13 is a circuit diagram showing the relevant components of the MRAM of this embodiment.

As shown in FIG. 13, memory cells 53 each including the magnetoresistive element 1 and the select transistor Tr are arranged in a matrix. One terminal of each of the memory cells 53 belonging to the same column is connected to the same bit line 32, and the other terminal is connected to the same bit line 42. The gate electrodes of the select transistors Tr of the memory cells 53 belonging to the same row are connected to one another by a word line 39, and are further connected to a row decoder 51.

The bit lines 32 are connected to a current source/sink circuit 55 via a switch circuit 54 of a transistor or the like. Also, the bit lines 42 are connected to a current source/sink circuit 57 via a switch circuit 56 of a transistor or the like. The current source/sink circuits 55 and 57 supply a write current to the bit lines 32 and 42 connected thereto, or pull out the write current from the bit lines 32 and 42 connected thereto.

The bit lines 42 are also connected to read circuits 52. Alternatively, the read circuits 52 may be connected to the bit lines 32. The read circuits 52 each include a read current circuit and a sense amplifier.

At a time of writing, the switch circuits 54 and 56 connected to the write target memory cell, and the select transistor Tr are switched on, to form a current path via the target memory cell. In accordance with the information to be written, one of the current source/sink circuits 55 and 57 functions as the current source, and the other one of the current source/sink circuits 55 and 57 functions as the current sink. As a result, the write current flows in the direction corresponding to the information to be written.

As for the write speed, spin-injection writing can be performed with a current having a pulse width from several nanoseconds to several microseconds.

At a time of reading, a read current that is so small as not to cause magnetization switching is supplied from the read circuit 52 to the magnetoresistive element 1 designated in the same manner as in writing. The read circuit 52 then determines the resistance state of the magnetoresistive element 1 by comparing the current value or the voltage value derived from the resistance value corresponding to the magnetization state of the magnetoresistive element 1 with a reference value.

At a time of reading, the current pulse width is preferably smaller than that at a time of writing. With this, wrong writing with the read current can be reduced. This is based on the fact that a write current with a small pulse width leads to a write current with a large absolute value.

As described above, this embodiment can provide a magnetic memory having a high magnetoresistance ratio and a high perpendicular magnetic anisotropy.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
    a first magnetic layer;
    a second magnetic layer;
    a first nonmagnetic layer disposed between the first magnetic layer and the second magnetic layer;
    a third magnetic layer disposed between the first magnetic layer and the first nonmagnetic layer; and
    a first layer disposed between the first magnetic layer and the third magnetic layer, the first layer being in direct contact with both the first magnetic layer and the third magnetic layer,
    wherein the first layer contains at least one element selected from the group consisting of Co, Fe, Ni, and Mn, and at least one element selected from the group consisting of Ta, Mo, Zr, Nb, Hf, V, Ti, Sc, and La.

2. The magnetoresistive element according to claim 1, wherein the first layer includes an amorphous layer.

3. The magnetoresistive element according to claim 1, wherein the first layer contains more than 60 atomic % of the at least one element selected from the group consisting of Co, Fe, Ni, and Mn.

4. The magnetoresistive element according to claim 1, wherein the first magnetic layer contains at least one element selected from a first group consisting of Co, Fe, Ni, and Mn, and at least one element selected from a second group consisting of Pd, Pt, Ru, Rh, Ag, and Au.

5. The magnetoresistive element according to claim 4, wherein the first magnetic layer has an artificial lattice containing at least one element selected from the first group and at least one element selected from the second group.

6. The magnetoresistive element according to claim 1, further comprising a fourth magnetic layer disposed between the first nonmagnetic layer and the second magnetic layer.

7. The magnetoresistive element according to claim 6, further comprising a second layer disposed between the fourth magnetic layer and the second magnetic layer.

8. The magnetoresistive element according to claim 7, wherein the second layer contains at least one element selected from the group consisting of Co, Fe, Ni, and Mn, and at least one element selected from the group consisting of Ta, Mo, Zr, Nb, Hf, V, Ti, Sc, and La.

9. The magnetoresistive element according to claim 7, wherein the second layer includes an amorphous layer.

10. A magnetic memory comprising:
the magnetoresistive element according to claim 1;
a first wiring electrically connected to the first magnetic layer; and
a second wiring electrically connected to the second magnetic layer.

11. The magnetic memory according to claim 10, further comprising
a first circuit configured to flow a write current between the first magnetic layer and the second magnetic layer.

12. The magnetic memory according to claim 10, further comprising
a second circuit configured to flow a read current between the first magnetic layer and the second magnetic layer.

13. The magnetic memory according to claim 10, wherein the first layer includes an amorphous layer.

14. The magnetic memory according to claim 10, wherein the first layer contains more than 60 atomic % of the at least one element selected from the group consisting of Co, Fe, Ni, and Mn.

15. The magnetic memory according to claim 10, wherein the first magnetic layer contains at least one element selected from a first group consisting of Co, Fe, Ni, and Mn, and at least one element selected from a second group consisting of Pd, Pt, Ru, Rh, Ag, and Au.

16. The magnetic memory according to claim 15, wherein the first magnetic layer has an artificial lattice containing at least one element selected from the first group and at least one element selected from the second group.

17. The magnetic memory according to claim 10, further comprising a fourth magnetic layer disposed between the first nonmagnetic layer and the second magnetic layer.

18. The magnetic memory according to claim 17, further comprising a second layer disposed between the fourth magnetic layer and the second magnetic layer.

19. The magnetic memory according to claim 18, wherein the second layer contains at least one element selected from the group consisting of Co, Fe, Ni, and Mn, and at least one element selected from the group consisting of Ta, Mo, Zr, Nb, Hf, V, Ti, Sc, and La.

20. The magnetic memory according to claim 18, wherein the second layer includes an amorphous layer.

21. The magnetoresistive element according to claim 1, wherein the first layer contains at least one element selected from the group consisting of Fe, Ni, and Mn, and at least one element selected from the group consisting of Ta, Mo, Zr, Nb, Hf, V, Ti, Sc, and La.

22. The magnetoresistive element according to claim 1, wherein the first layer contains Co, Mo, and at least one element selected from the group consisting of Ta, Zr, Nb, Hf, V, Ti, Sc, and La.

* * * * *